US010884628B2

(12) United States Patent
Yang et al.

(10) Patent No.: US 10,884,628 B2
(45) Date of Patent: Jan. 5, 2021

(54) PERFORMANCE OF A READ IN A MEMORY SYSTEM

(71) Applicant: Western Digital Technologies, Inc., San Jose, CA (US)

(72) Inventors: Niles Yang, San Jose, CA (US); Phil Reusswig, San Jose, CA (US); Alexandra Bauche, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 47 days.

(21) Appl. No.: 16/227,168

(22) Filed: Dec. 20, 2018

(65) Prior Publication Data

US 2020/0201546 A1 Jun. 25, 2020

(51) Int. Cl.
*G06F 3/06* (2006.01)

(52) U.S. Cl.
CPC ............ *G06F 3/061* (2013.01); *G06F 3/0655* (2013.01); *G06F 3/0679* (2013.01)

(58) Field of Classification Search
CPC ...... G06F 3/061; G06F 3/0655; G06F 3/0679; G06F 2212/7211; G06F 2212/1032; G06F 12/0246; G06F 2212/1016; G06F 2212/7205; G06F 2212/7206; G11C 2029/0409; G11C 2029/021; G11C 16/3418; G11C 2029/0411; G11C 29/028; G11C 11/5642; G11C 16/26

USPC .......................................................... 714/704
See application file for complete search history.

(56) References Cited

U.S. PATENT DOCUMENTS

| | | | | |
|---|---|---|---|---|
| 9,947,401 | B1* | 4/2018 | Navon | G11C 13/0069 |
| 10,002,086 | B1* | 6/2018 | Achtenberg | G06F 11/1048 |
| 10,026,483 | B1* | 7/2018 | Shah | G11C 29/021 |
| 2014/0164880 | A1* | 6/2014 | Chen | G06F 11/1012 714/773 |
| 2015/0085575 | A1* | 3/2015 | Tam | G11C 29/50004 365/185.11 |
| 2018/0032396 | A1* | 2/2018 | Sharon | G11C 11/5642 |

* cited by examiner

*Primary Examiner* — James C Kerveros
(74) *Attorney, Agent, or Firm* — Dickinson Wright PLLC; Steven Hurles

(57) ABSTRACT

Improving performance of a read in a memory system. Various methods include: reading data from a word line in a memory block, where during the read, associated parameters are generated that include: a value indicative of a throughput time, and a value indicative of a bit error rate (BER); retrieving the value indicative of the throughput time and the value indicative of the BER; and performing a read improvement process if the value indicative of the throughput time is above a threshold value. The method also includes performing the read improvement process by: flagging the memory block if the value indicative of the BER is at or below and expected BER; and performing cleanup operations if the value indicative of the BER is higher than the expected BER.

7 Claims, 14 Drawing Sheets

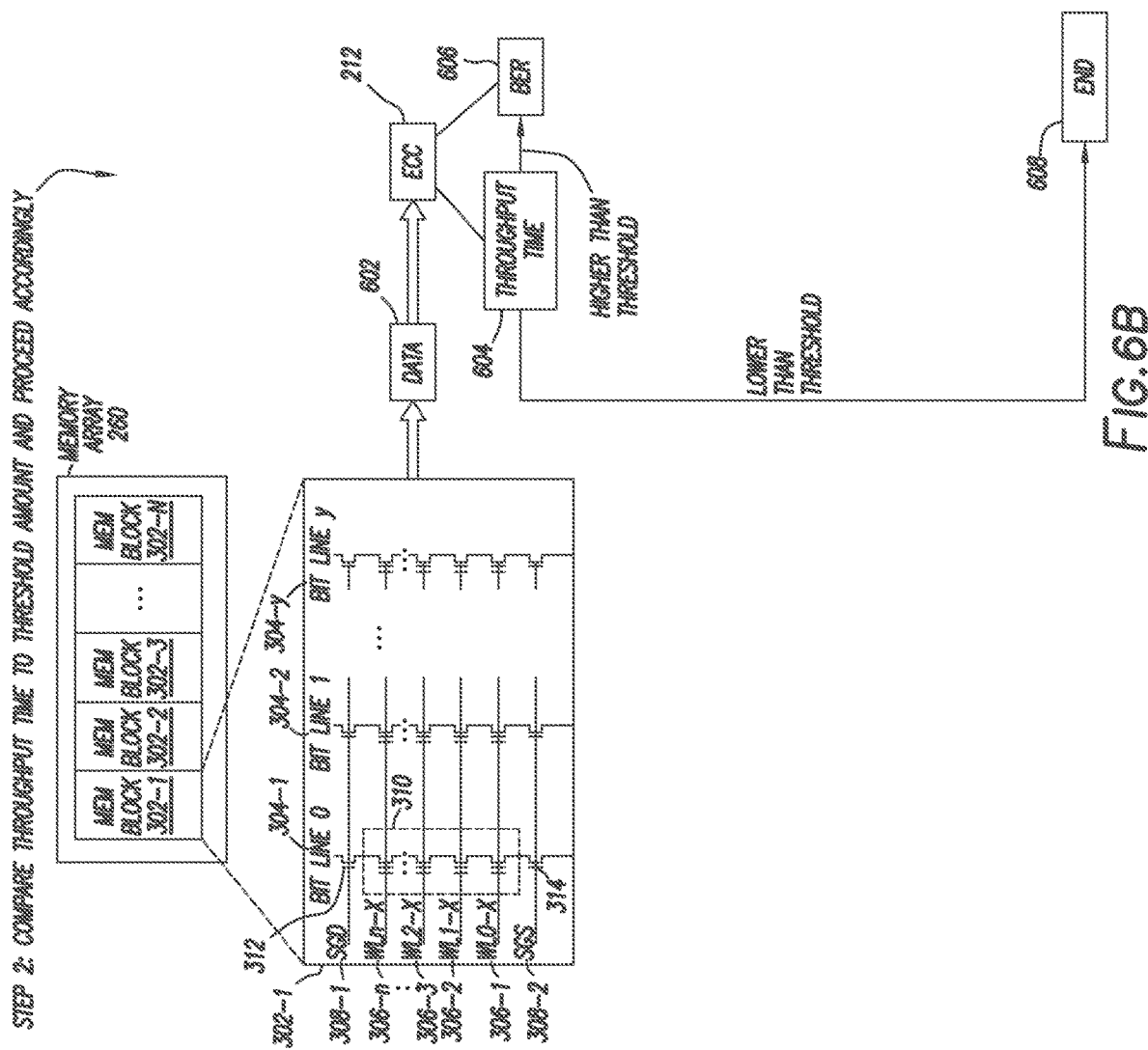

US 10,884,628 B2

PERFORMANCE OF A READ IN A MEMORY SYSTEM

BACKGROUND

Non-volatile memory systems provide a type of computer memory that retains stored information without requiring an external power source. One type of non-volatile memory, flash memory, is widely used in various computing devices and in stand-alone memory devices. For example, flash memory can be found in laptops, digital audio player, digital cameras, smart phones, video games, scientific instruments, industrial robots, medical electronics, solid state drives, USB drives, memory cards, and the like.

Various implementations of flash memory aim to increase storage capacity. For example, the implementation and architecture of flash memory enables single level cell (SLC) devices, where each cell stores one bit of information, and multi-level cell (MLC) devices including triple-level cell (TLC) devices, where each cell stores more than one bit of information. Additional advances in flash memory also include changes in the flash memory architecture that stack memory cells (3D NAND) in order to increase storage capacity at a reduced cost per gigabyte. As flash memory continues to increase in storage capacity and density, the various memory cells can become increasingly difficult to read.

SUMMARY

Various embodiments include a method for improving performance of a read in a memory system including: reading data from a word line in a memory block, where during the read, associated parameters are generated that include: a value indicative of a throughput time, and a value indicative of a bit error rate (BER); retrieving the value indicative of the throughput time and the value indicative of the BER; and performing a read improvement process if the value indicative of the throughput time is above a threshold value.

The method further includes performing the cleanup operations by: adjusting a set of read parameters associated with the memory block; determining a result of adjusting the set of read parameters is fail, where the adjusting includes: modifying the set of read parameters to create modified read parameters, reading a test data from the word line using the modified read parameters, where reading the test data generates a value indicative of a test bit error rate, and determining the value indicative of the test bit error rate is above a BER threshold; and performing a read scrub that moves the data to a different location.

Other embodiments include a computer readable media or computer readable storage media storing instructions that are executable by a processor to cause a memory system to: read data in a memory block, where the memory block includes a plurality of word lines, and the data is located in a first word line of the plurality of word lines; retrieve a value indicative of a throughput time and a value indicative of a bit error rate (BER), where the value indicative of the throughput time and the value indicative of the BER are generated during the read; and perform a read improvement process if the value indicative of the throughput time is above a threshold value. The instructions further cause the memory system to: flag the memory block if the value indicative of the BER is at or below an expected BER; and perform cleanup operations if the value indicative of the BER is higher than the expected BER.

When the memory system performs the cleanup operations, the instructions can further cause the memory system to adjust a set of read parameters associated with the memory block; determine a result of adjusting the set of read parameters is fail, where when the memory system adjusts the set of read parameters, the instructions further cause the memory system to: modify the set of read parameters to create modified read parameters, read a test data from the first word line using the modified read parameters, retrieve value indicative of a test bit error rate, where the value indicative of the test bit error rate is generated during the read of the test data, and determine the value indicative of the test bit error rate is above a BER threshold; and perform a read scrub that moves the second data to a different location.

In some embodiments, when the memory system performs the cleanup operations, the instructions further cause the memory system to: determine the value indicative of the BER is at or below and expected BER; and flag the memory block. The instructions can further cause the memory system to: determine that a number of times the memory block is flagged is above a threshold amount; and perform cleanup operations that include: adjust a set of read parameters associated with the memory block; and perform a read scrub if a result of adjusting the set of read parameters is fail.

Additional embodiments include a non-volatile storage system including a memory array, where the memory array includes a plurality of non-volatile memory cells arranged as memory blocks, and a first memory block of the memory blocks includes a word line storing a first data; and a controller coupled to the memory array. The controller is configured to read the first data from the first memory block; retrieve from an error correction engine, a value indicative of a throughput time and a value indicative of a bit error rate (BER); and perform a read improvement process if the value indicative of the throughput time is above a threshold value. The controller is further configured to: flag the memory block and the word line if the value indicative of the BER is at or below and expected BER; and perform cleanup operations if the value indicative of the BER is higher than the expected BER.

BRIEF DESCRIPTION OF THE DRAWINGS

For a detailed description of example embodiments, reference will now be made to the accompanying drawings in which:

FIGS. 6A-6E illustrate conceptual and method diagrams in which a memory block is read and monitored, in accordance with some embodiments.

DEFINITIONS

Figure 1A:
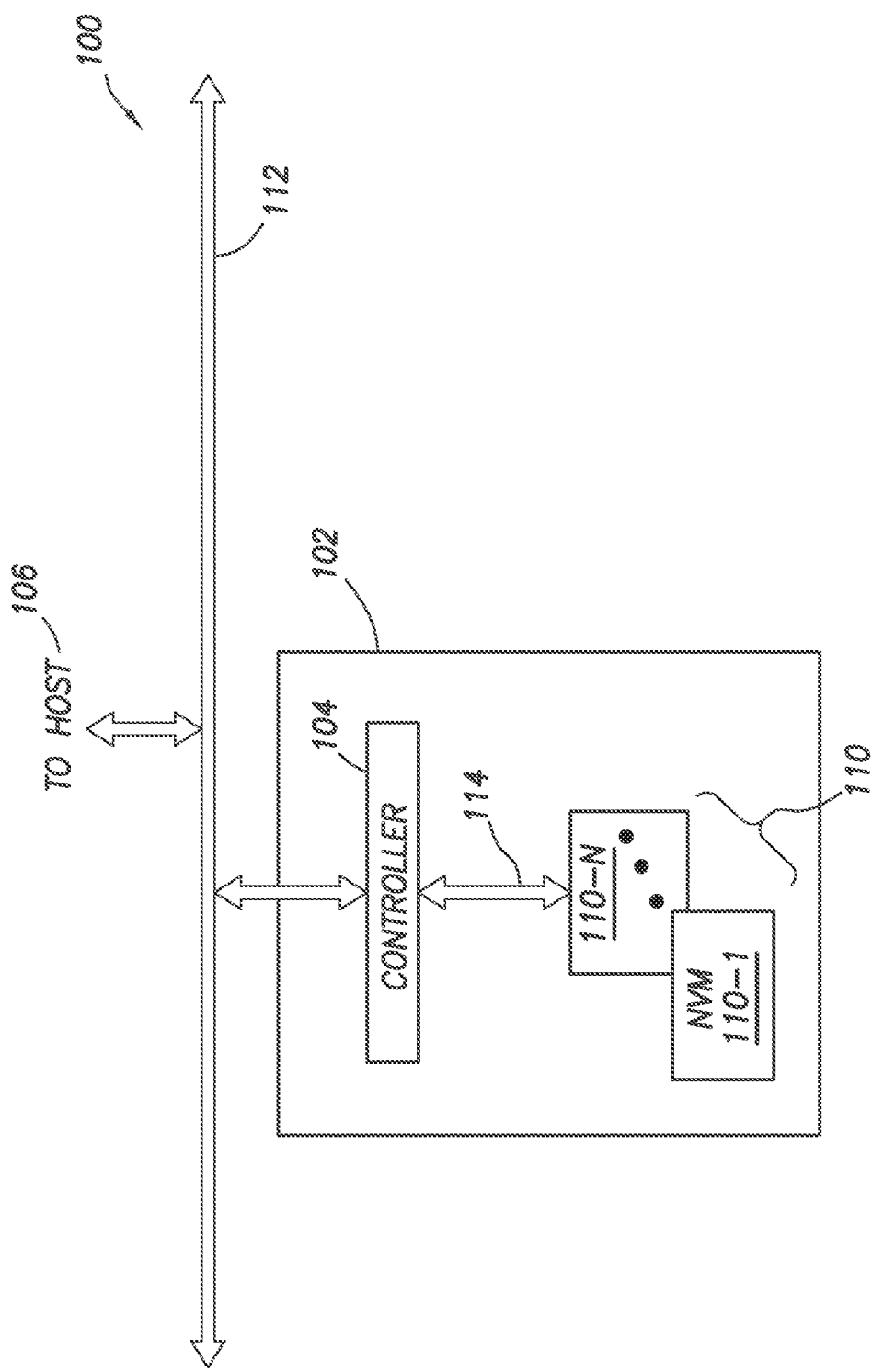
FIGS. 1A-1B illustrates a block diagram of an example non-volatile memory system, in accordance with some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

At least some of the example embodiments are directed to improving a performance of a read in a memory system. A dynamic read approach includes adjusting the read parameters that are used to read a particular memory block, such that a bit error rate (BER) of data read out of a particular block, is reduced. Any amount of resources—i.e., time and effort—can be dedicated to optimizing the read parameters in order to reduce the bit error rate. A reduced bit error rate decreases the throughput time of an error correction engine. Fewer errors in the data mean the error correction engine performs fewer error correction-related tasks and thus decreasing the throughput time of the error correction engine. However, there exists a certain point after which there are diminished returns to optimizing the read parameters in an effort to reduce the bit error rate. That is, at a certain point, the read parameters are optimized "enough", after which point, attempts to further improve the read parameters do not improve a throughput time of the error correction engine.

Methods disclosed herein analyze parameters associated with data that is read out of a memory block, including throughput time and a bit error rate (BER) associated with the data. The parameters are generated during the read, by the error correction engine, and can reflect the amount of time taken to decode the data and the rate of error present in the data. Both the throughput time and the BER are analyzed to determine any additional actions taken to improve future reads. In particular, in cases where the throughput time is at or lower than a threshold (e.g., the time taken to perform the read falls within an ideal amount of time), no further action is taken; the read is considered good.

If the throughput time is higher than the threshold value (e.g., decoding is taking too long) additional action is taken that includes performing a read improvement process. The read improvement process can include actions such as: flagging the memory block for additional monitoring; and the separate actions of re-adjusting the read parameters and performing a read scrub of the data in the memory block. The separate actions of re-adjusting of the read parameters and performing a read scrub are collectively referred to as "cleanup operations."

Upon commencing the read improvement process, the methods determine which of the actions—i.e., as between flagging the memory block and performing the cleanup operations—based on how the BER compares to an expected BER threshold. For example, if the BER is higher than the expected BER threshold, then cleanup operations are performed (e.g., re-adjusting the read parameter or performing a read scrub of the data in the memory block). If the BER is lower than the expected BER threshold, then instead of immediately performing cleanup operations, the memory block is flagged for additional monitoring. If a memory block has been flagged a certain number of times, then cleanup operations are performed on the memory block. The specification now turns to an example computer architecture that utilizes memory, in accordance with example embodiments.

FIG. 1A illustrates a block diagram of an example system architecture 100 including non-volatile memory. In particular, the example system architecture 100 includes storage system 102, a controller 104, and a host 106. In various embodiments, the host 106 can include any device or system that utilizes the storage system 102. The host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, and the like. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Furthermore, the host 106 can use adapters into which a memory card is plugged. The foregoing examples of a host are not meant to be limiting examples. On the contrary, a host 106 can include any type of device, system, and apparatus that accesses the storage system 102.

In FIG. 1A, the storage system 102 includes its own memory controller and drivers (e.g., controller 104)—as will be described further below—but other embodiments of the storage system 102 include memory-only units that are instead controlled by software executed by a controller on the host 106 (e.g., a processor of a computing device controls—including error handling of—the storage unit 102). Furthermore, although FIG. 1A illustrates the storage system 102 as separate from the host 106, in some embodiments, the storage system 102 is embedded with the host 106, where the memory, controller, and drivers are formed on a single integrated circuit chip. The host 106 communicates to the storage system 102 by way of a bus 112 that implements any known or after developed communication protocol that enables the storage system 102 and the host 106 to communicate. Some non-limiting examples of a communication protocol include Secure Digital (SD) protocol, Memory stick (MS) protocol, USB protocol, or Advanced Microcontroller Bus Architecture (AMBA).

In various embodiments, the controller 104 acts as an interface between the host 106 and the storage system 102. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In other embodiments, the controller 104 is a processor executing within the host 106.

Still referring to FIG. 1A, according to some embodiments, the controller 104 acts as an interface between the host 106 and the storage system 102 and manages data stored on the storage system 102. For example, the host 106 can access data stored in the storage system 102 by providing a logical address to the controller 104 which the controller 104 converts to a physical address. The controller 104 can access the data or particular storage location associated with the physical address and facilitate transferring data between the storage system 102 and the host 106. In embodiments where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104) Thus, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells or NOR flash memory cells. As the memory cells are non-volatile, the memory cells in the storage system 102 retain data even when there is a disruption in the power supply. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers.

According to some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, or 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

The methods described herein are directed to improving a performance of a read in the storage system 102. The controller 104 monitors and analyzes data associated with a read including a throughput latency and a bit error rate associated with a particular read. Prior to describing the methods in accordance with various embodiments, additional aspects of the storage system 102 are described.

Figure 1B:
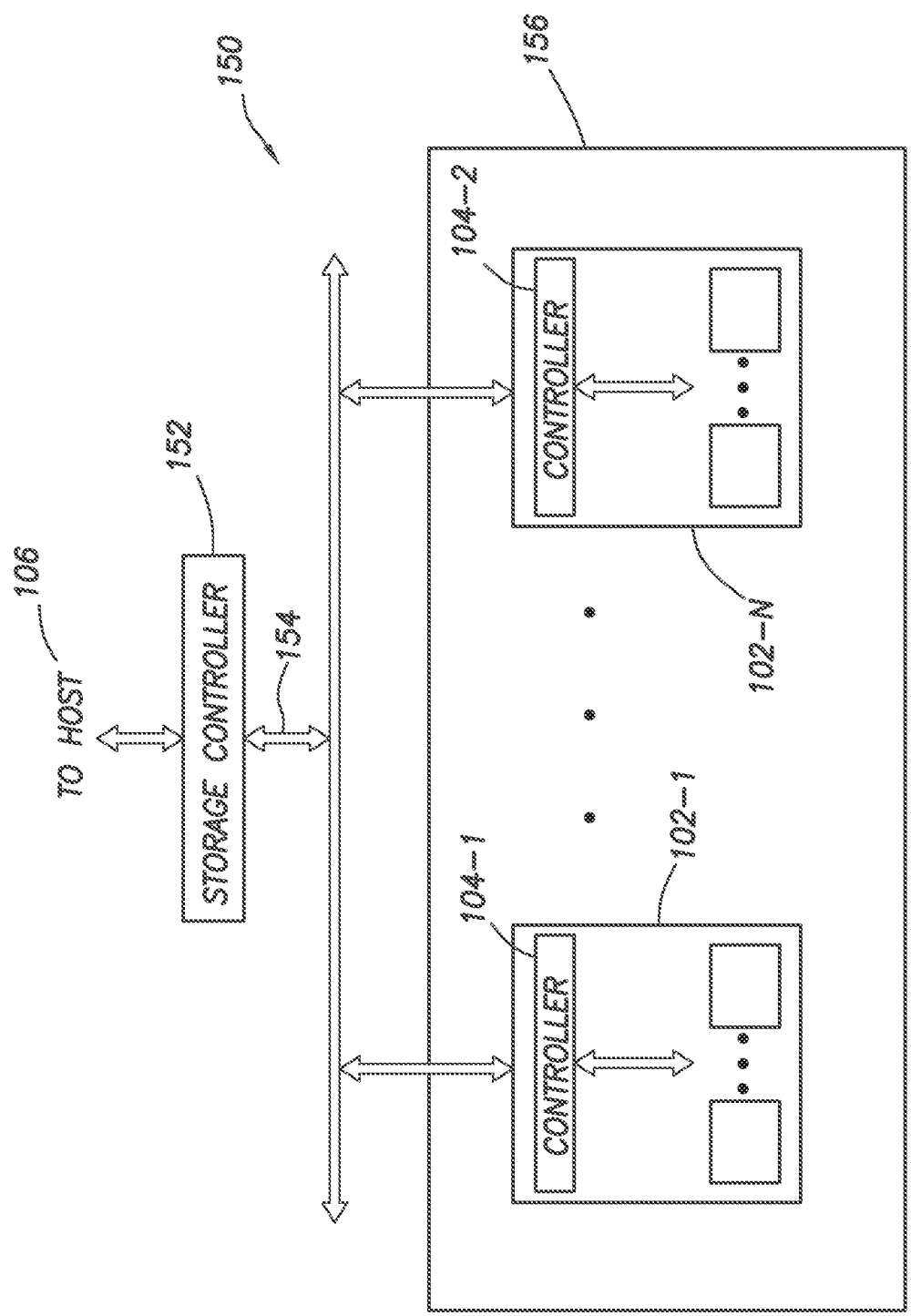

FIG. 1B shows a block diagram of a system architecture in accordance with at least some embodiments. More specifically, and as shown in FIG. 1B, the system architecture 100 can be implemented as part of a larger system architecture. For example, as shown in FIG. 1B, the system architecture 150 includes a storage module 156 that further includes several storage systems 102. Within the example system architecture 150 the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components. Next, additional details of the controller 104 are described.

Figure 2A:
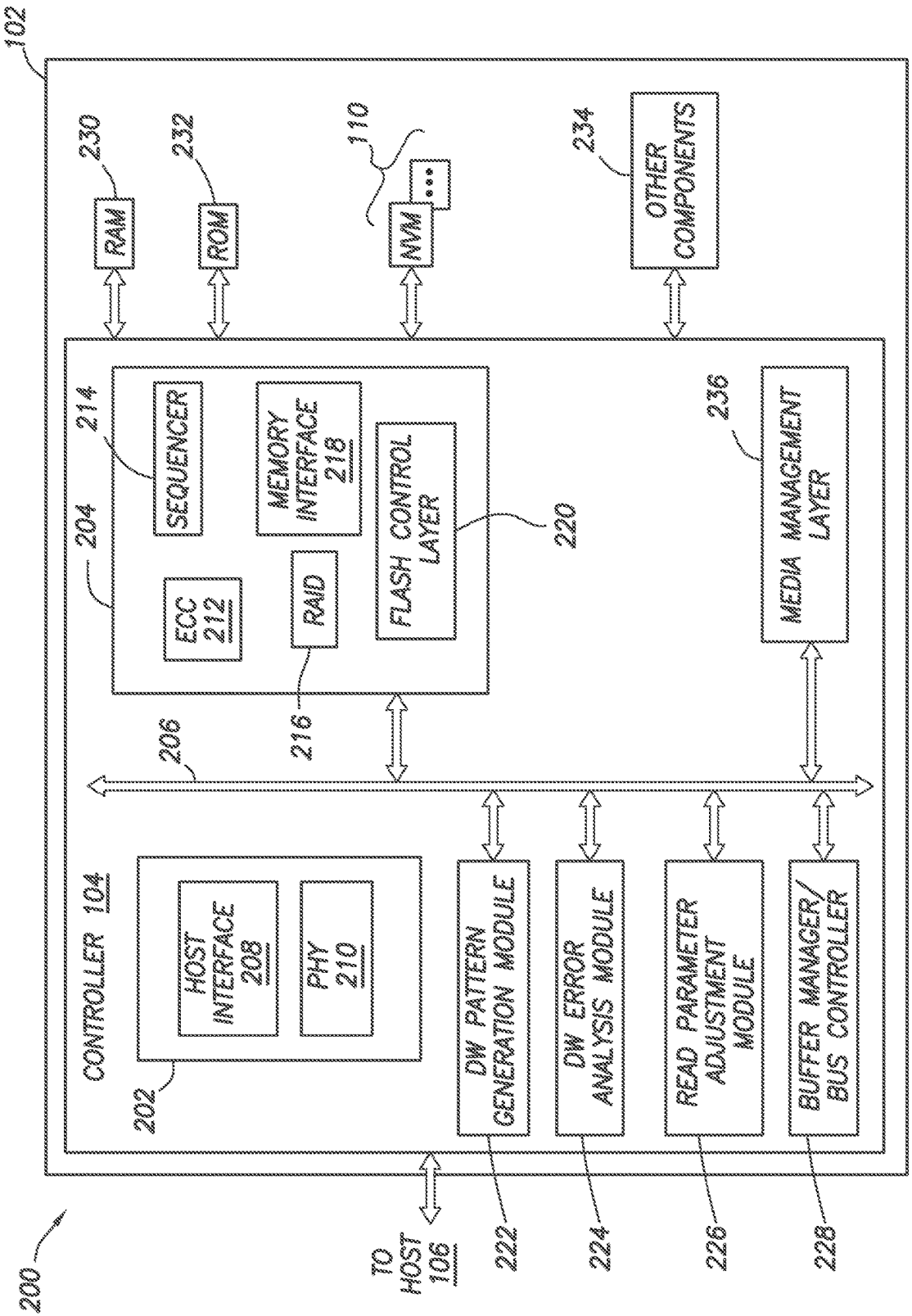
FIG. 2A illustrates a block diagram of example components of a controller, in accordance with some embodiments.

FIG. 2A shows a block diagram of a storage system in accordance with at least some embodiments. In FIG. 2A, a block diagram 200 of the storage system 102 illustrates additional details with respect to the controller 104 (introduced in FIG. 1A). The block diagram 200 of the storage system 102 illustrates components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In other cases, portions of the RAM 230 or ROM 232, respectively, can be located outside the controller 104 and within the controller 104. In other embodiments, the controller 104, the RAM 230, and the ROM 232 are located on separate semiconductor die. In various embodiments, the other components 234 include external electrical interfaces, external RAM, resistors, capacitors, logic gates, or other components that interface with the controller 104.

The discussion now turns to the various modules that can be included within the controller 104. In accordance with example embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules described in FIG. 2A are not limited to being executed within the controller 104; one or more modules can be executed outside the controller 104. As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. Thus, the controller can be configured with hardware and/or firmware to perform the various functions described herein.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 in configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data. To detect errors, the ECC engine 212 implements various types of error checking using algorithms such as LDPC (low-density parity-check) code, BCH (Bose-Chaudhuri-Hocquenghem) codes, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the non-volatile memory die 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, the example controller 104 includes a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 114 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110. Accordingly, modules and components within an example controller 104 have been described.

Figure 2B:
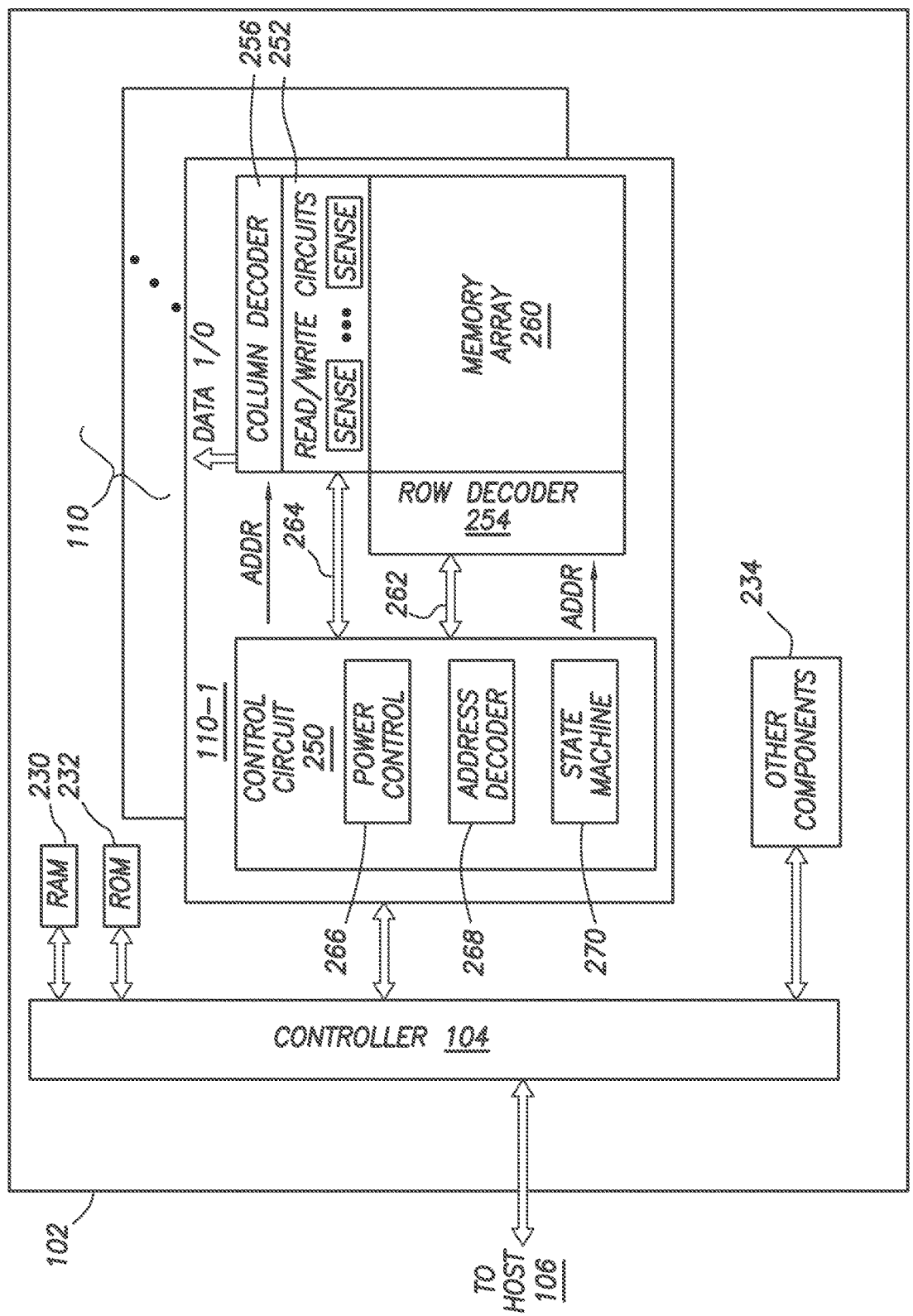
FIG. 2B illustrates a block diagram of example components of a non-volatile memory storage system, in accordance with some embodiments.

FIG. 2B shows a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all the memory die within NVM memory block 110.

In various embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256. The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260 which reduces the densities of access lines and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as "managing circuits." The control circuit 250 and its various managing circuits, are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
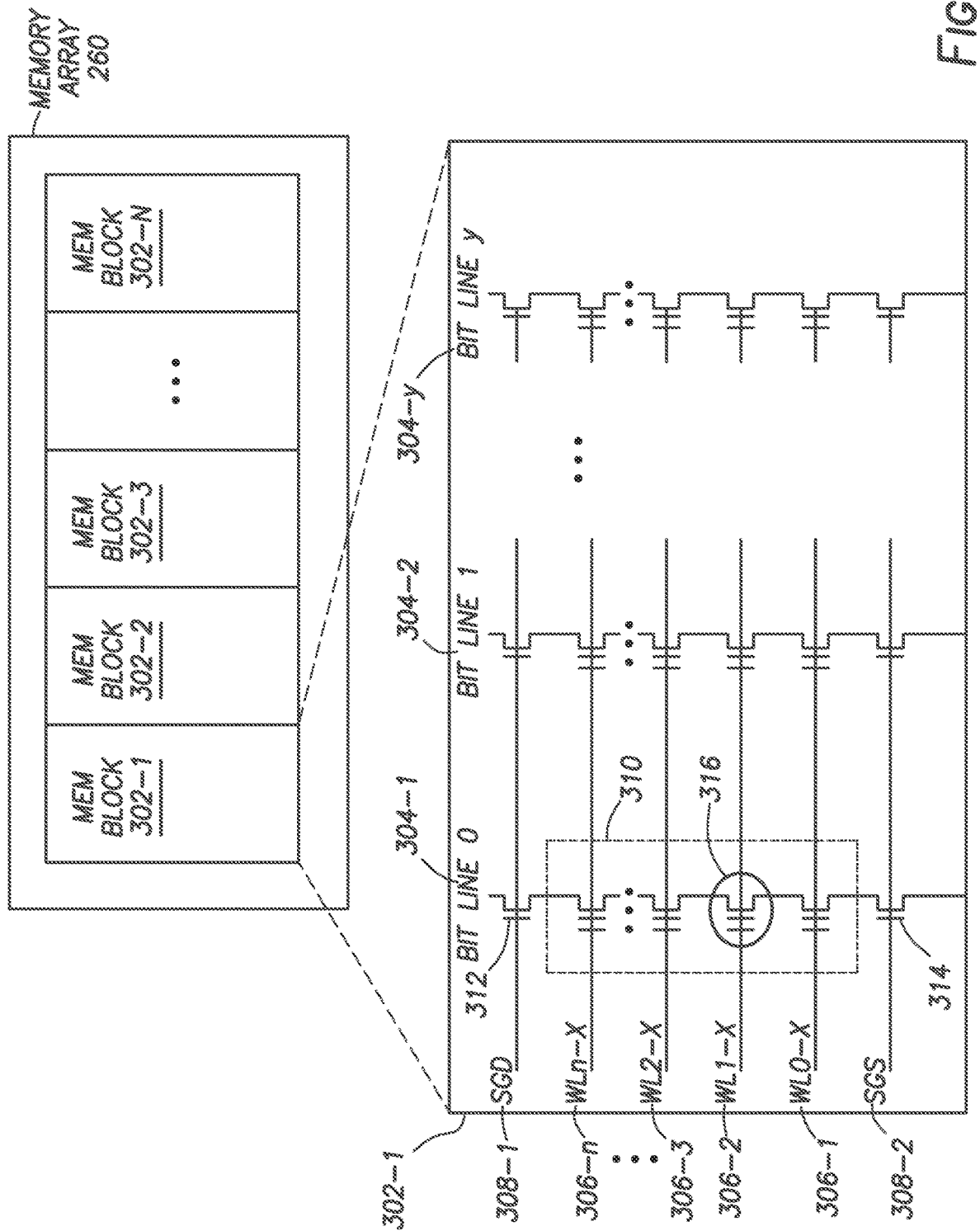
FIG. 3 illustrates a memory block, in accordance with some embodiments.

FIG. 3 shows additional aspects of the memory array 260 in accordance with at least some embodiments. In particular, the memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example the memory array 260 includes 1,024 blocks. Additionally, each of the memory blocks 302 can conceptually be divided into a number of pages defined as a unit of programming. In one embodiment, a page of data can be stored in one row of memory cells. Each page can include user data and overhead data, where the overhead data includes ECC that has been calculated from the user data.

Each block 302, for example block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

Figure 4:
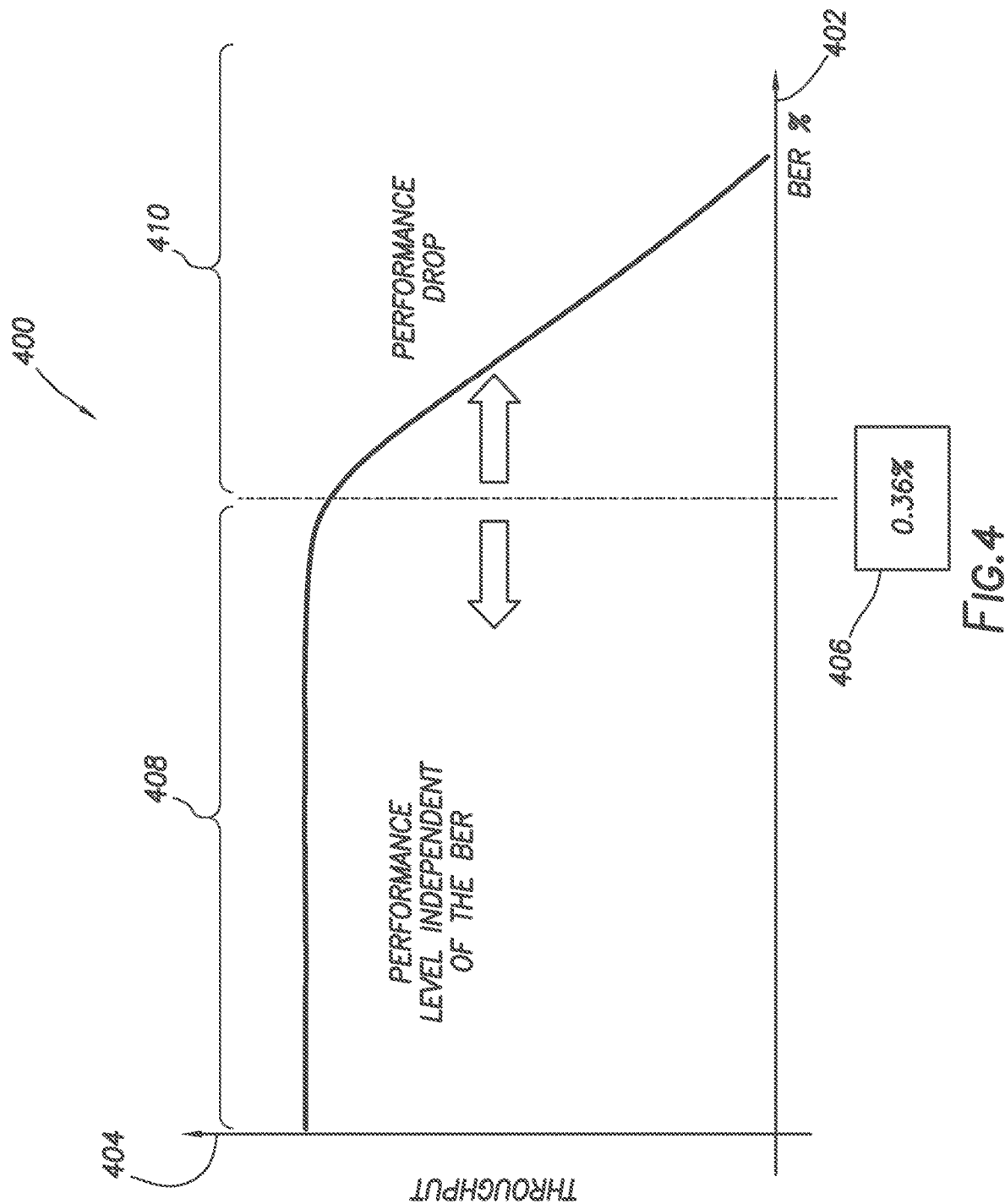
FIG. 4 illustrates a line graph, in accordance with some embodiments.

FIG. 4 shows a graph illustrating a relationship of throughput to the bit error rate in accordance with at least some embodiments. In particular, FIG. 4 illustrates a graph 400 that demonstrates an observed relationship between the effectiveness of an ECC engine, such as an LDPC ECC decoding engine, and a percentage of BER occurring in data. The X-axis 402 represents possible BER percentage values occurring in a data. The Y-axis 404 represents a throughput performance of the ECC engine processing data of a given size. For a given data size (e.g., 4 kilobytes (KB)), the throughput measures an average speed of the ECC engine 212 to decode data and pass the data through the data path. In some embodiments, the throughput is measured in megabytes per second (MB/s).

In FIG. 4, the graph 400 shows, the throughput performance of the ECC engine does not change significantly for particular BER percentages ranging from close to zero (e.g., the data is nearly perfect with little to no error), to about 0.36% (e.g., region 408). The region 408 represents the region in graph 400 where the BER percentages range from zero to 0.36%. After around a 0.36% rate of BER, as the BER percentage rate increases (e.g. increasing number of errors in the data), the throughput performance of the ECC engine drops significantly in a linear manner (e.g., region 410). The region 410 represents the region in graph 400 where the BER percentages range from 0.36% and beyond.

In the example relationship shown in graph 400, the BER occurring in a data does not impact the throughput performance of the ECC engine as long as the BER is at or below 0.36%. However, as the bit error rate increases above the example threshold of 0.36%, throughput performance falls as illustrated. Methods are implemented by the controller 104, such as re-adjusting the read parameters associated with a particular memory block, to reduce the BER occurring in data read from the memory block. The operation of re-adjusting the read parameter can be extensive and time consuming in an effort to reach the lowest possible BER values in a particular memory block. However, as illustrated in the graph 400, re-adjusting read parameters in order to achieve BER values below 0.36% does not increase or improve the performance of the ECC engine throughput. Thus, during operations that re-adjust read parameters, in some embodiments, the target BER value is around 0.36%. The BER value of 0.36% is referred to herein as the "expected BER." Accordingly, graph 400 illustrates reasons why an expected BER has a value of 0.36%.

Figure 5:
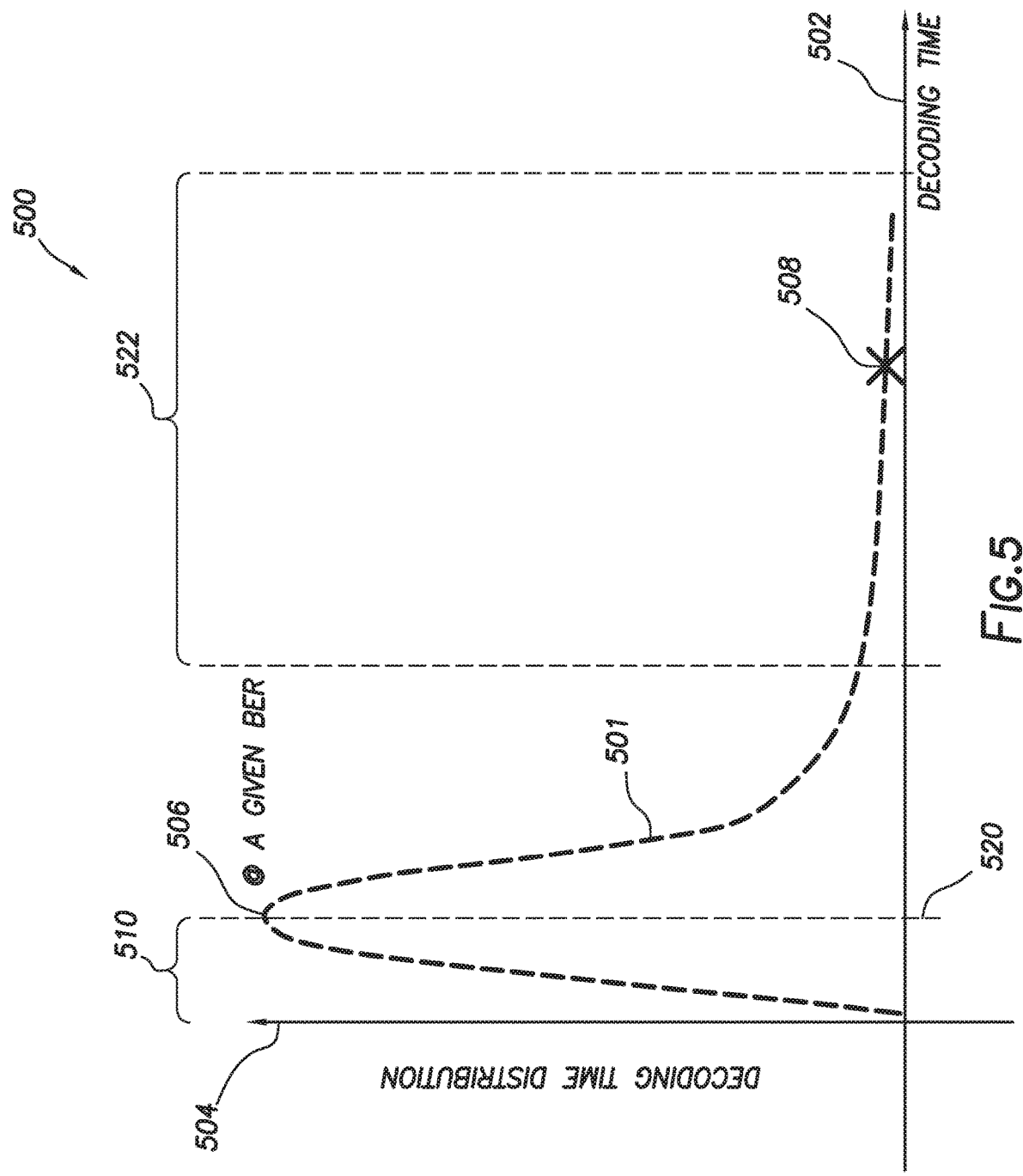
FIG. 5 illustrates a distribution curve, in accordance with some embodiments.

FIG. 5 shows a graph 500 illustrating a relationship between decoding time distribution and decoding time, in accordance with at least some embodiments. For a given BER, the data decoding time is not always the same, and instead the data decoding time has some distribution. FIG. 5 shows a distribution graph 500 that illustrates a distribution curve 501 for a given BER, observed during reads in the storage system 102 (FIG. 1). The X-axis 502 represents the time an ECC engine takes to decode data with a particular BER, where the values along the X-axis can range from zero seconds to one millisecond. The Y-axis 504 represents a quantity of reads having a respective decoding time. Thus, the distribution curve 501 illustrates a distribution of the various decoding times for data with a given BER. The distribution curve 501 has the shape of a binomial distribution curve that peaks around vertex 506 and has an extended tail region 522 that gradually slopes down and extends to the right side of the graph.

Thus, for a given BER—consider for purposes of this discussion a given BER of 0.2%—fewer reads have decoding times that are close to zero seconds than reads with decoding times occurring around the X-value 520. Additionally, fewer reads have decoding times that take up to 300 microseconds or 1 millisecond than reads with decoding times occurring around the X-value 520. Accordingly, as represented by the vertex 506, the decoding time for a large amount of reads, where the data has a given BER of 0.2%, have a decoding time occurring around the X-value 250. In some embodiments, the X-value 250 is around 1 microsecond.

In contrast, as captured by the tail of the curve 501 (e.g., point 508), a read can take up to 1000 times longer than the decoding time at point 506. For example, the decoding time around point 508 represents a decoding time from about 300 microseconds, and in another example, up to 1 millisecond. Thus, although the BER is relatively low (0.2%), and even below an expected BER (e.g., 0.36%), some reads and associated decoding times are longer than is desirable. A read that falls within the tail region 522 of the distribution curve 501 impacts the efficiency of the storage system 102. Even with a relatively low BER (e.g., 0.2%), the reads that fall within the tail region 522 take longer to decode than desired (e.g., sometimes 300 microseconds to 1 millisecond) to complete the read. Accordingly, methods described herein address possible reasons for the longer decoding time—i.e., throughput time.

FIGS. 6A-6E illustrate conceptual and method diagrams in which an example memory block is read and monitored, according to some embodiments. In particular, in one example case the controller 104 (FIG. 1) performs the methods described herein. However, the methods described herein as performed by the controller 104 is not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

In accordance with example embodiments, parameters that are generated during the read are analyzed to determine whether to perform a read improvement process on the memory block. Performing the read improvement process results in improving the performance of future reads from a respective memory block. In some embodiments, the improvement of performance of future reads is realized at the memory block level—i.e., all reads in the memory block are improved. Additionally, the improvement of the performance of the future reads is realized at the word line level. As parameters are analyzed before commencing a read improvement process, not every read results in performance of a read improvement process.

For purposes of this discussion, a read improvement process includes three processes that are not limited to being performed in any specific order nor is the read improvement process limited to performing all three processes. The three processes include flagging a memory block, adjusting a set of read parameters, and performing a read scrub. Each process will be discussed in further detail below, as well as the conditions under which each process is performed. Furthermore, the two processes including adjusting the set of read parameters and performing a read scrub are collectively referred to herein as "cleanup operations".

Figure 6A:
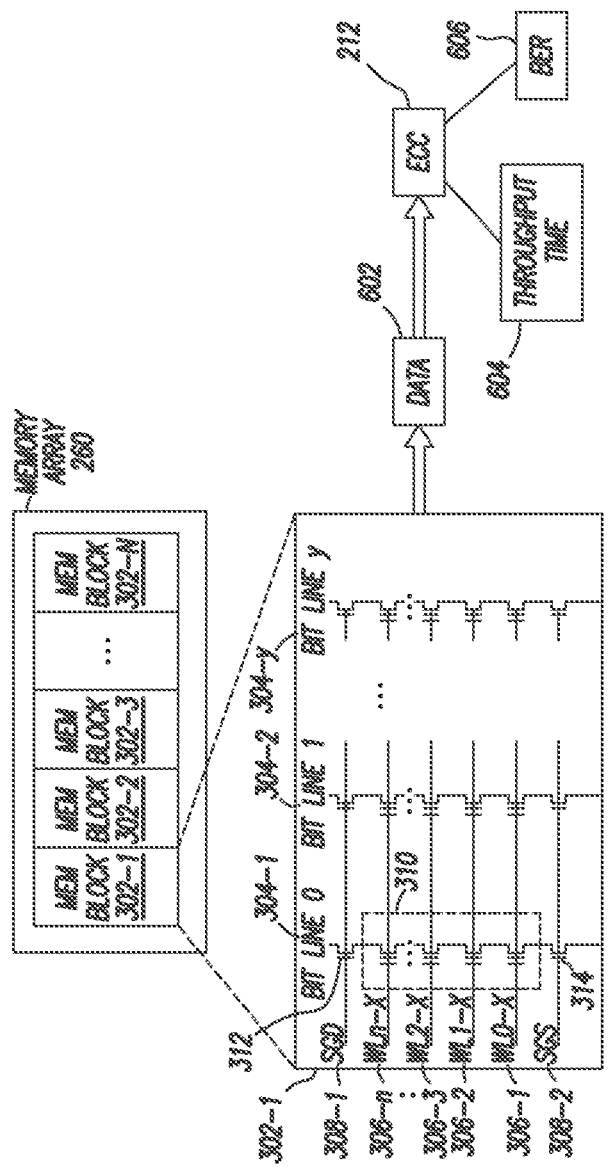

FIG. 6A illustrates a read from the example memory block 302-1, part of the memory array 250. During the example read, data 602 is retrieved from the memory block 302-1 and processed by the ECC engine 212, where the ECC engine 212 decodes the data 602, checks for errors, and corrects errors. During the read, associated parameters are generated—e.g., by the ECC engine 212—such as throughput time 604 and a BER 606. Firmware or software—e.g., executed by the controller (e.g., the controller 104, FIG. 1A)—which analyzes the throughput time 604 and the BER 606, retrieves the associated parameters from registers in the ECC engine 212. The registers in the ECC engine 212 are example locations where the associated parameters are stored, other locations can be used such as the RAM 230. The throughput time 604 represents the time taken to recover the data (e.g., decode, check for errors, and correct errors). The BER 606 represents the bit error rate of the data 602.

In Step 2 of FIG. 6B, upon retrieving the associated parameters, the controller 104 determines whether to perform the read improvement process based on how respective values of the throughput time 604 and the BER 606 compare to respective thresholds. The threshold amount for the throughput time can vary in example systems from 1 microsecond to 50 microseconds. In one example, if the throughput time 604 is at or below a threshold amount (e.g., 1.2 microseconds), the read improvement process is not performed by the controller. That is, regardless of the bit error rate of the data 602, if the throughput time 604 is at or below the threshold value, the controller concludes that future reads from the memory block 302-1 do not need additional intervention or action to improve a performance of subsequent reads from the memory block 302-1 (e.g., block 608). The read is performed within the throughput threshold amount. The controller can discard the throughput time 604 and the BER 606 after determining no additional action will be performed.

In contrast, if the throughput time 604 is above the threshold value—e.g., above 1.2 microseconds—the controller performs the read improvement process. The controller determines which of the processes to perform, as between flagging and the cleanup operations, by analyzing the BER 606. In Step 3 of FIG. 6C, the controller determines how the BER 606 compared to an expected BER and proceeds accordingly. The expected BER for a particular memory block is calculated when data is programmed into the memory block. For example, when the data 602 was programmed into the memory block 302-1, the expected BER is also calculated during this time. For example, the expected BER is determined after a set of read parameters is determined for reading data out of the memory block 302-1. The set of read parameters includes read pass voltages that are applied to the word lines and select lines of the memory block 302-1 during a read. Further, the read parameters are adjusted such that a resultant BER is below a target BER (e.g., 0.36% as discussed in FIG. 4).

During programming of the memory block 302-1, a module such as the read parameter adjustment module 226 adjusts voltages—i.e., read parameters—applied to individual word lines and select lines (e.g., by way of control circuit 250), and verifies the read parameters result in data that is read from the memory block 302-1, having a BER (e.g., an expected BER), that is below the target BER threshold of 0.36%. Thus, the target BER is different from the expected BER. The target BER represents a value that the read parameter adjustment module 226 can target when adjusting voltages applied to a respective memory block. The target BER can be the same for all memory blocks within the memory array 250. In contrast, the expected BER can vary between each of the memory blocks within the memory array 250. In accordance with various embodiments, the controller retrieves the expected BER associated with the memory block 302-1 from various locations through the storage system 102 including the RAM 230.

Still referring to Step 2 of FIG. 6B, the controller takes different approaches depending on whether the BER 606 is higher than the expected BER or is lower than or meets the expected BER. If the BER 606 is higher than the expected BER, then the controller 104 commences with cleanup operations (e.g., block 620). As part of the cleanup operations 620, initially the controller attempts to adjust the read parameters (e.g., block 610) which can be performed by way of the read parameter adjustment module 226. When the controller adjusts the read parameters, the controller recalibrates or re-adjusts the previously stored read parameters, where adjusting includes increasing or decreasing the voltage levels of the previously stored read parameters. The result of adjusting the read parameters can include success or fail—and as described further below in FIG. 6E—the result of adjusting the read parameters can further direct the next steps taken by the controller 104 in an attempt to improve a performance of the read. The result of adjusting the read parameters is success if a bit error rate occurring in the data after the read parameters is adjusted (e.g., resultant BER) is at or lower than a target BER (e.g., 0.36% as discussed in FIG. 4). The result of adjusting the read parameters is fail if a bit error rate occurring in the data after the read parameters is adjusted (e.g., resultant BER) is above the target BER.

In the event that the BER 606 is lower than the expected BER, the controller initially refrains from performing cleanup operations and instead flags the word line and memory block from which the data 602 was read from (e.g., memory block 302-1 and word line 306-2). In accordance with some embodiments, the controller can additionally increase power applied to the ECC engine 212 for subsequent reads from the memory block 302-1 or the word line 306-2. Accordingly, the controller can perform the flagging procedure at the memory block level and/or the word line level. Thus, the controller flags the memory block 302-1 in situations where the throughput time 604 is higher than a threshold value but the BER 606 is at or below the expected BER.

Various circumstances can result in a low BER and a high throughput time. For example, the ECC engine 212 may not have sufficient power to operate at desired speeds (e.g., the ECC engine 212 operates at a slower speed) during a particular read. Such a scenario can result in the ECC engine taking a long time, which results in a high throughput time, even when the particular data has a low bit error rate. In another example, the data pattern can also play a role, such as a data pattern with hard errors. Accordingly, when the presented scenario includes a low BER and a high throughput time, the controller performs a read improvement process that includes flagging the memory block and word line but the controller does not immediately commence the cleanup operations. As discussed further below—the controller commences cleanup operations after a word line or memory block is flagged a predetermined number of times.

Figure 6C:
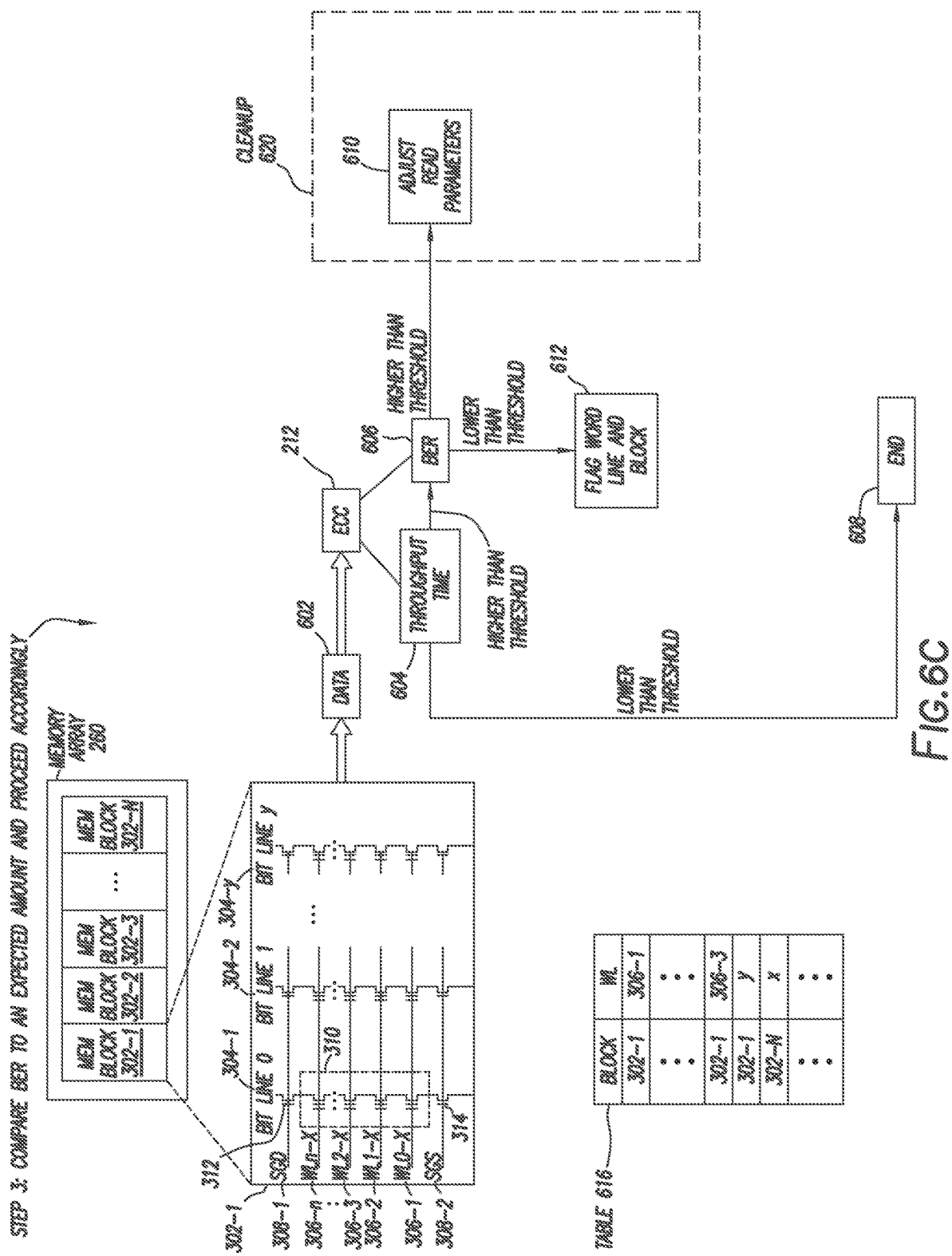
Figure 6D:
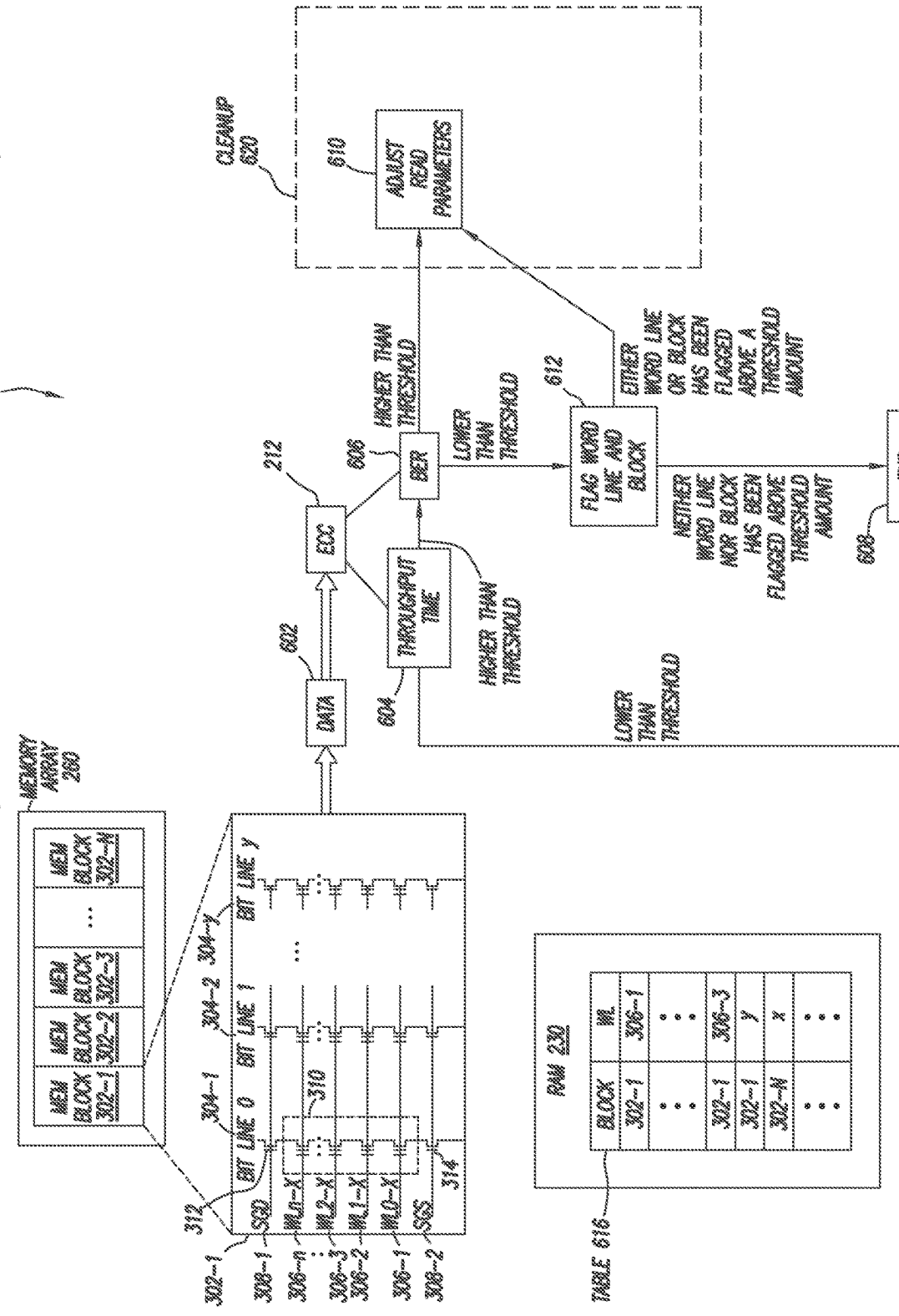

As shown in Step 4 of FIG. 6D, after flagging a word line and a memory block, additional steps taken by the controller include no further action (e.g., block 608) or commencing cleanup operations (e.g., block 620). In particular, after flagging a particular word line and memory block, the controller makes an additional determination as to whether the word line 306-2 or the memory block 302-1 have been flagged above a threshold number and proceed accordingly. If a memory block has not been flagged above the threshold number, no further action is taken. Similarly, in embodiments where word lines are tracked, if a word line has not been flagged above a threshold number, no further action is taken (e.g., block 608). In embodiments where the memory block and word lines are both tracked, if either is flagged about a threshold number, the controller commences with the cleanup operations (e.g., block 620).

In one example, a table 616 (e.g., stored within RAM 232 or NVM memory blocks 110) tracks particular word lines and memory blocks that have been flagged previously. In the example table 616, both word lines and associated memory blocks are tracked, and in some embodiments, only the memory blocks are tracked. Information such as a particular memory block or a particular word lines that has been flagged above a threshold number is used by the controller to determine whether to commence cleanup operations. As described further below—the cleanup operations can be performed at the block level or the word line level.

The example table 616 is not meant to be a limiting example of the manner in which memory blocks and word lines are flagged and tracked. Any method for flagging and tracking can be used without departing from the scope of this disclosure. For example, a memory block can have a dedicated counter that is advanced each time the memory block is flagged. For the purposes of this disclosure, the term "advance" as pertaining to a counter includes both incrementing and decrementing the counter. Additionally, the number of times a memory block or word line has been flagged within a threshold amount of time can also be tracked. Accordingly, a controller can commence the cleanup operations if a memory block has been flagged above the threshold number within a certain time frame.

If a memory block or a word line has been flagged more than a threshold amount, the controller commences with the cleanup operations 620 including adjusting read parameters (e.g., block 610), which can be performed at the memory block level or the word line level. Continuing the example in which table 616 is used and considering a threshold number of two, the memory block 302-1 has been flagged three times in the table 616. Upon determining the memory block 302-1 has been flagged more than the example threshold number, the controller performs the cleanup operations 620 including adjusting read parameters (e.g., block 610).

Figure 6E:
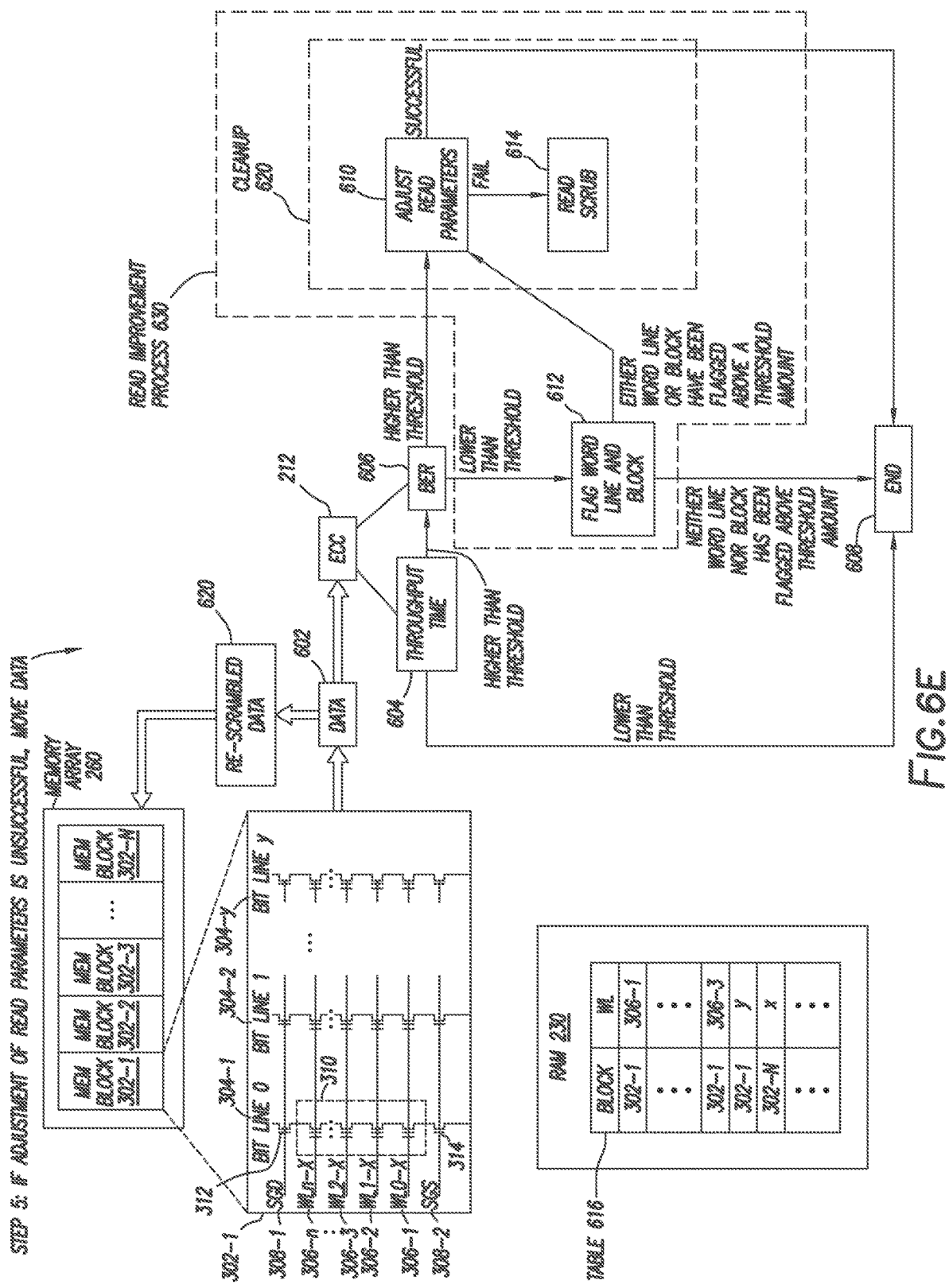

In Step 5 of FIG. 6E, the controller performs additional steps as part of the cleanup operations (e.g., identified as dashed box 620). More specifically, as part of the cleanup operations 620, if a result of adjusting the read parameters (FIG. 6C) is fail (e.g., the resultant BER is higher than a target BER), the controller performs a read scrub (e.g., block 614). During a read scrub, the controller reprograms the data in the memory block 302-1 into a different memory block (e.g., memory block 302-N). A read scrub can include the steps of decoding the data in the memory block 302-N, re-scrambling the data, and storing the data in a different, random memory block.

More specifically, in an effort to address issues associated with data pattern sensitivity, during a re-scrambling operation, the controller employs different scrambling seeds such that the data is entirely re-randomized. In one example, the data 602 is initially scrambled using a first scrambling seed, then during the read scrub that includes a re-scrambling operation, the data 602 is re-scrambled using a second scrambling seed, different from the first scrambling seed. Thus, during a read scrub (e.g., block 614), the data 602 is re-scrambled using a new and independent randomizations process to create re-scrambled data 620 (e.g., the data 602 is re-scrambled using scrambling seeds different from previously used scrambled seeds) and moved to a different block within the memory array 260. A read scrub can also be performed at the word line level, where only the data in a particular word line is re-scrambled and moved to a different word line in the same or different memory block.

To summarize, the controller performs a read improvement process (e.g., identified as dashed box 630) if the throughput time associated with the particular read is above a threshold value—e.g., the read took longer than the threshold value. The read improvement process 630 includes processes such as flagging a memory block and performing cleanup operations 620. The cleanup operations 620 are performed by the controller when either the initial BER associated with a particular read is higher than a threshold or if a particular memory block or word line has been flagged above a threshold number. Considering the scenario where the throughput time is higher than a threshold value, if the BER associated with the particular read is higher than the expected BER, the controller commences with the cleanup operations 620. Considering the same scenario where the throughput time is higher than a threshold value, but the BER associated with the particular read is at or below the expected BER, the controller initially flags the memory block. If the controller determines the memory block has been flagged above a threshold number, the controller commences with the cleanup operations 620, and more specifically starts with adjusting the read parameters 610. If the result of adjusting the read parameters 610 is success, the controller 104 does not perform the rest of the cleanup operations 620. If the result of adjusting the read parameters 610 is fail, the controller 104 performs a read scrub 614.

Accordingly, the storage system 102 can monitor a particular read by analyzing associated parameters, including a throughput time and a BER associated with the particular read. The associated parameters are analyzed by the controller to determine whether to perform a read improvement process on the memory block. Not every read results in the controller performing the read improvement process; for example, a read improvement process is not performed when the throughput time is at or below a threshold value. Performing the read improvement process on a memory block results in improving the performance of future reads from the memory block in a manner that is efficient and calculated. For example, the read improvement process is performed on those memory blocks that are not performing within defined expectations.

Figure 7:
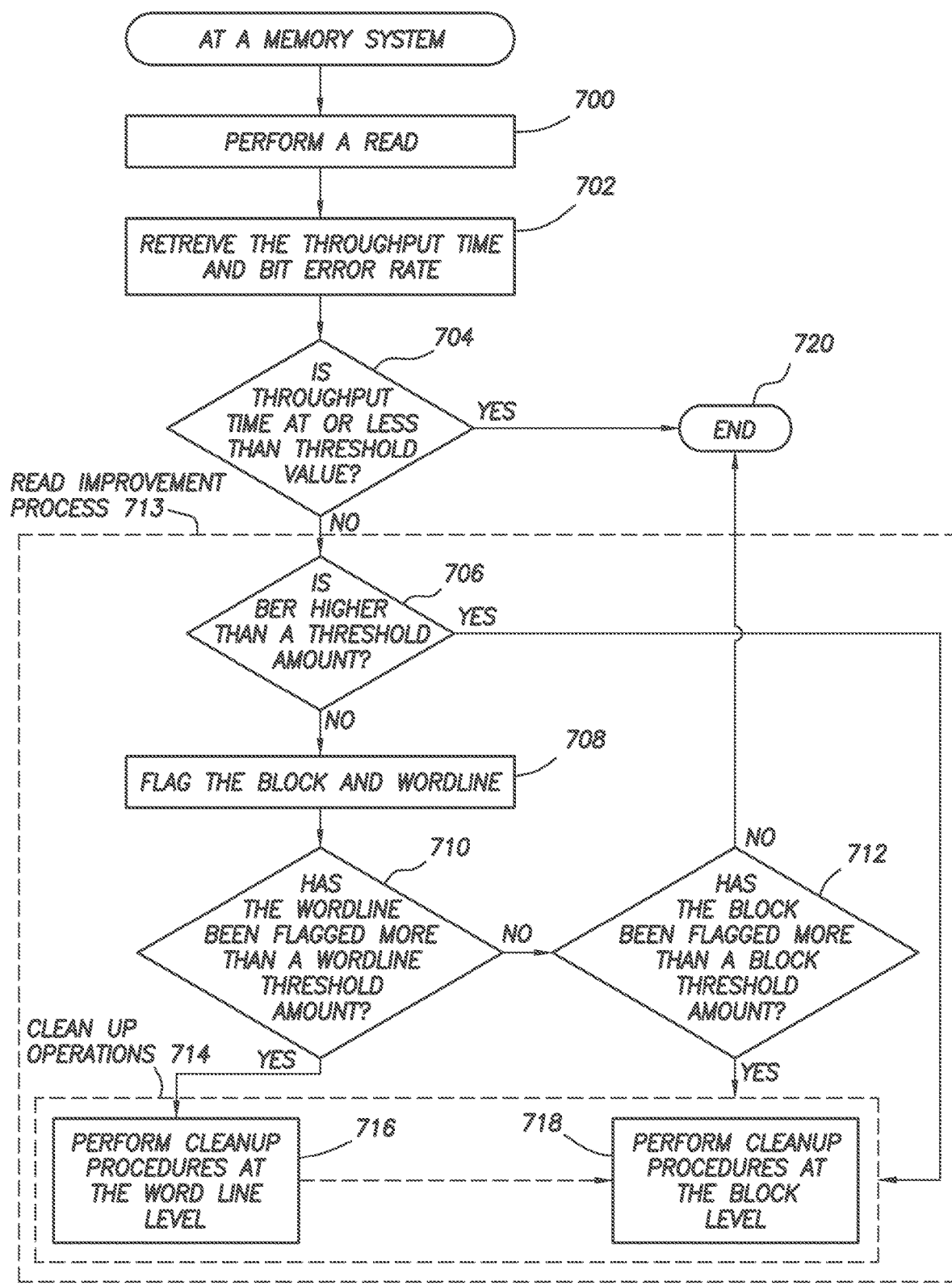
FIG. 7 illustrates a method diagram, in accordance with some embodiments.

FIG. 7 shows a method in accordance with at least some embodiments. In particular, the method is performed at a memory system (e.g., the storage system 102) and includes performing a read (block 700). Performing the read includes reading data from a word line in a memory block, where during the read, associated parameters are generated that include: a value indicative of a throughput time, and a value indicative of a bit error rate (BER). The memory system retrieves the throughput time and the bit error rate (block 702). The value indicative of throughput time and the value indicative of BER are analyzed to determine a quality of the read. (e.g., FIGS. 6B and 6C).

More specifically, the memory system determines if the throughput time (e.g., value indicative of the throughput time) is at or less than a threshold amount (decision block 704 and e.g., FIG. 6B). If the throughput time is at or less than the threshold value, the method performed at the memory system ends (block 720) and the memory system continues monitoring additional reads beginning with block 700. If the throughput time is above the threshold value, the memory system commences the read improvement process (e.g., dashed block 713). The memory system determines the particular processes to perform based on the BER (e.g., value indicative of BER). In particular, the memory system determines how the BER compares to a threshold amount such as an expected BER (block 706 and e.g., FIG. 6C).

If the BER is higher than the threshold amount, the memory system commences the cleanup operations (dashed block 714). The cleanup operations include adjusting read parameters and performing read scrubs. The cleanup operations can be performed at a word line level (block 716) or at a block level (block 718). Thereafter, the memory system can continue to monitor additional reads within the memory system (e.g., starting at block 700).

If the BER is at or below the threshold amount, the memory system flags the memory block and word line which the data was read from (block 708 and e.g., FIG. 6C). Next the memory system determines whether the word line has been flagged more than a word line threshold amount (decision block 710 and e.g., FIG. 6D). Additionally, the memory system determines whether the memory block has been flagged more than a block threshold amount (decision block 712 and e.g., FIG. 6D). If neither the word line nor the memory block have been flagged more than a respective threshold amount, thereafter, the memory system can continue to monitor additional reads within the memory system (e.g., starting at block 700). If either the word line or the memory block have been flagged more than a respective threshold amount, the memory system performs cleanup operations (dashed block 714). The cleanup operations can be performed at a word line level (block 716) or at a block level (block 718). Thereafter, the memory system can continue to monitor additional reads within the memory system (e.g., starting at block 700).

Figure 8:
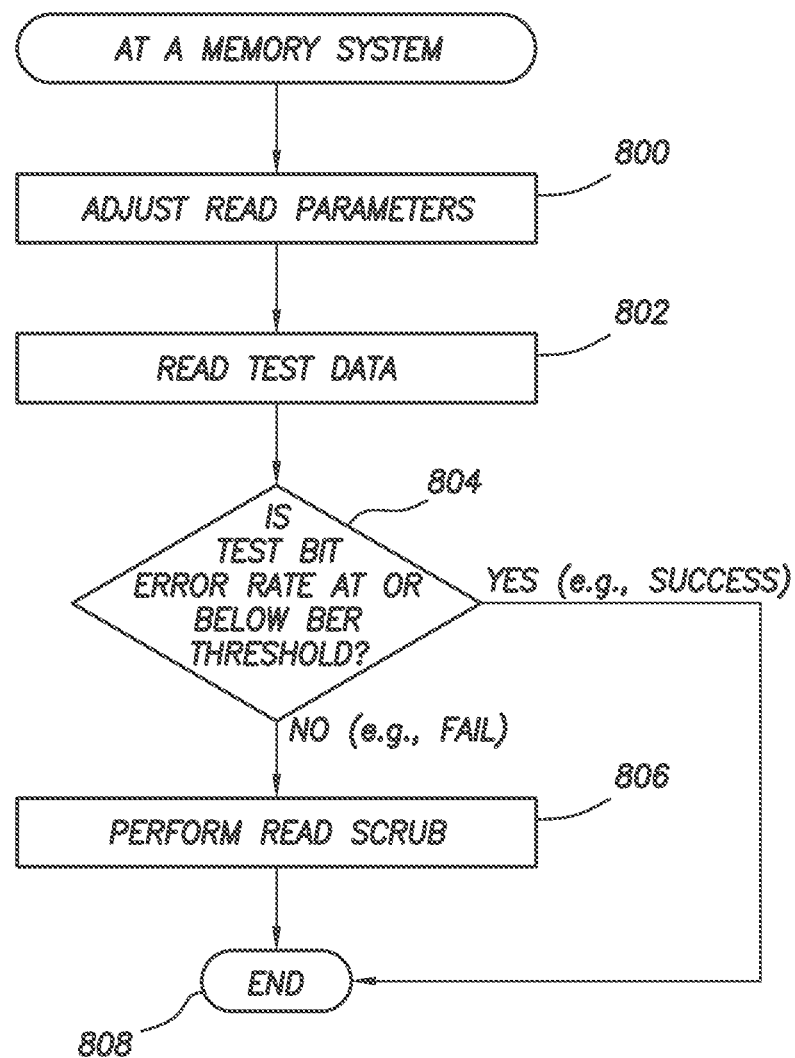
FIG. 8 illustrates a method diagram, in accordance with some embodiments.

FIG. 8 shows a method of cleanup operations in accordance with at least some embodiments. In particular, the method is performed at a memory system (e.g., the storage system 102) and includes adjusting read parameters (block 800 and e.g., FIG. 6E) to create modified read parameters. The memory system reads test data (block 802) from a memory block using the modified read parameters to generate a value indicative of a test bit error rate. The memory system determines whether the test bit error rate is at or below a BER threshold (decision block 804). For example, the BER threshold can be set at 0.36%. If the test bit error rate is at or below the BER threshold—e.g., a result of adjusting the read parameters is success—the memory system ends the method (block 808) and can continue to monitor additional reads. If the test bit error rate is above the BER threshold—e.g., a result of adjusting the read parameters is fail—then the memory system performs a read scrub (block 806). The read scrub can be performed at the block level or the word line level. After that, the method performed by the memory system ends (block 808) and the memory system continue to monitor additional reads.

The above discussion is meant to be illustrative of the principles and various embodiments of the present invention. Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. It is intended that the following claims be interpreted to embrace all such variations and modifications.

What is claimed is:

1. A method of improving performance of a read in a memory system comprising:
    reading data from a word line in a memory block, and generating associated parameters that include:
        a value indicative of a throughput time, and
        a value indicative of a bit error rate (BER);
    retrieving the value indicative of the throughput time and the value indicative of the BER; and
    performing a read improvement process if the value indicative of the throughput time is above a threshold value, the read improvement process comprising:
        performing cleanup operations if the value indicative of the BER is higher than an expected BER, the cleanup operations comprising:
            modifying a set of read parameters associated with the memory block, thereby creating modified read parameters,
            reading test data from the word line using the modified read parameters and generating a value indicative of a test bit error rate,
            determining if the value indicative of the test bit error rate is above a BER threshold, and
            flagging the memory block if the value indicative of the BER is at or below the expected BER;
        determining that a number of times the memory clock is flagged is above a threshold amount; and
        performing the cleanup operations.

2. The method of claim 1, the cleanup operations further comprising:
    if the BER indicative value is not above the BER threshold, performing a read scrub that re-scrambles the data using a scrambling seed different from a prior scrambling seed and moves the data to a different location.

3. The method of claim 1, further comprising retrieving the value indicative of the BER and the value indicative of the throughput time from registers of an error correction engine.

4. A non-transitory computer readable media storing instructions that are executable by a processor to cause a memory system to:

read data in a memory block, wherein:
   the memory block includes a plurality of word lines, and
   the data is located in a first word line of the plurality of word lines;
retrieve a value indicative of a throughput time and a value indicative of a bit error rate (BER), wherein the value indicative of the throughput time and the value indicative of the BER are generated based on the read; and
perform a read improvement process if the value indicative of the throughput time is above a threshold value, the read improvement process comprising:
   performing cleanup operations if the value indicative of the BER is higher than an expected BER, the cleanup operations comprising:
      modifying a set of read parameters associated with the memory block, thereby creating modified read parameters,
      reading test data form the word line using the modified read parameters and generating a value indicative of a test bit error rate,
      determining if the value indicative of the test bit error rate is above a BER threshold, and
      flagging the memory block if the value indicative of the BER is at or below the expected BER;
   determining that a number of times the memory clock is flagged is above a threshold amount; and
   performing the cleanup operations.

5. The non-transitory computer-readable media of claim 4, the cleanup operations further comprising:
   if the BER indicative value is not above the BER threshold, performing a read scrub that re-scrambles the data using a scrambling seed different from a prior scrambling seed and moving the second data to a different location.

6. A non-volatile storage system comprising:
a memory array, wherein:
   the memory array comprises a plurality of non-volatile memory cells arranged as memory blocks, and
   a first memory block of the memory blocks includes a word line storing a first data; and
a controller coupled to the memory array, wherein the controller is configured to:
   read the first data from the first memory block;
   retrieve, from an error correction engine, a value indicative of a throughput time and a value indicative of a bit error rate (BER); and
perform a read improvement process if the value indicative of the throughput time is above a threshold value, the read improvement process comprising:
   comprising performing cleanup operations if the value indicative of the BER is higher than an expected BER, the cleanup operations comprising:
      modifying a set of read parameters associated with the first memory block, thereby creating modified read parameters,
      reading test data form the word line using the modified read parameters and generating a value indicative of a test bit error rate,
      determining if the value indicative of the test bit error rate is above a BER threshold, and
      flagging the memory block if the value indicative of the BER is at or below the expected BER;
   determining that a number of times the memory clock is flagged is above a threshold amount; and
   performing the cleanup operations.

7. The non-volatile storage system of claim 6, the cleanup operations further comprising:
   if the BER indicative value is not above the expected BER, perform a read scrub that re-scrambles the data using a scrambling seed different from a prior scrambling seed and moves the first data to a different memory block.

* * * * *